United States Patent [19]
Saitou et al.

[11] Patent Number: 4,577,111
[45] Date of Patent: Mar. 18, 1986

[54] APPARATUS FOR ELECTRON BEAM LITHOGRAPHY

[75] Inventors: Norio Saitou, Iruma; Susumu Ozasa, Kashiwa; Takashi Matsuzaka, Kokubunji, all of Japan

[73] Assignee: Hitachi, Ltd., Tokyo, Japan

[21] Appl. No.: 516,091

[22] Filed: Jul. 22, 1983

[30] Foreign Application Priority Data

Jul. 28, 1982 [JP] Japan ................. 57-131476

[51] Int. Cl.$^4$ ............................................. H01J 37/26
[52] U.S. Cl. ................... 250/492.2; 250/398
[58] Field of Search ............ 250/310, 492.2, 396 ML, 250/398, 492.3, 311

[56] References Cited

U.S. PATENT DOCUMENTS 4,182,958 1/1980 Goto et al. ................. 250/492.2
4,393,310 7/1983 Hahn ......................... 250/492.2

FOREIGN PATENT DOCUMENTS 55-1186 1/1980 Japan .................... 250/396 ML
54-45025 4/1981 Japan .................... 250/492.3
56-152145 11/1981 Japan .................... 250/311
2005243 2/1981 United Kingdom ........... 250/492.2

OTHER PUBLICATIONS

Variably Shaped Electron Beam Lithography System, EB55: 11 Electron Optics, Saitou et al., J. Vac. Sci. Tech., vol. 19, No. 4, Nov./Dec. 1981.

Primary Examiner—Bruce C. Anderson
Assistant Examiner—Paul A. Guss
Attorney, Agent, or Firm—Antonelli, Terry & Wands

[57] ABSTRACT

An apparatus for electron beam lithography comprises at least one mask equipped with a polygonal aperture to be subjected to an electron beam from an electron beam generator, an electron lens system for demagnifying and imaging the polygonal aperture of the mask, and a solenoid coil for electron beam rotation adjustment placed between the mask and the final-stage electron lens.

6 Claims, 4 Drawing Figures

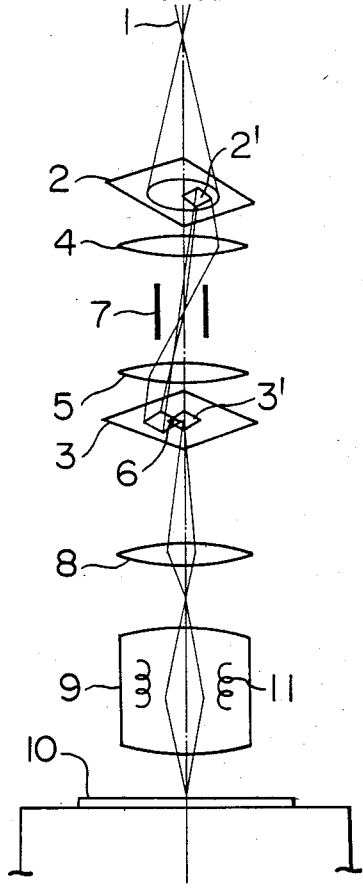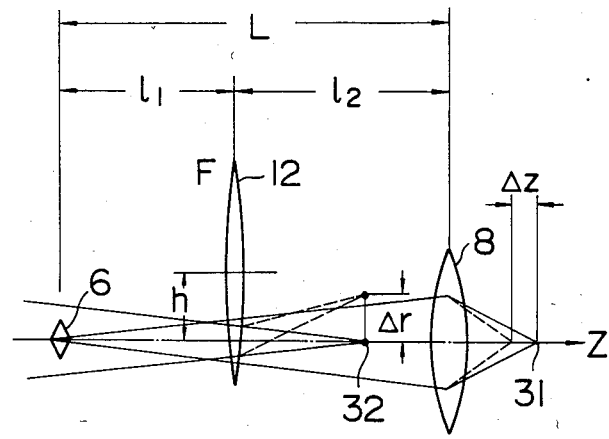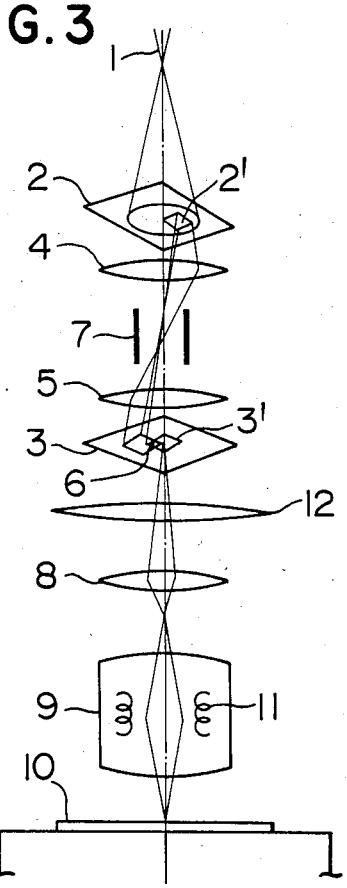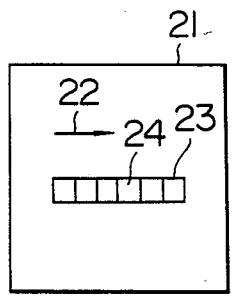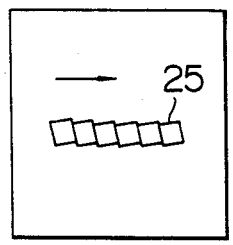

APPARATUS FOR ELECTRON BEAM LITHOGRAPHY

The present invention relates to an apparatus for electron beam lithography using a shaped beam which is used for fabrication of integrated circuits or the like.

For the purpose of exposing patterns at high speed and with high accuracy, an apparatus for variable shape electron beam lithography (hereinafter referred to as apparatus for lithography) has recently been used. FIG. 1 shows the principle of this apparatus for lithography (see J. Vac. Sci. Technol., 19 (4), Nov./Dec. 1981, p.p. 1087 to 1093). In FIG. 1, numeral 1 denotes an electron beam source, numerals 2 and 3 masks having square apertures, numerals 4 and 5 shaping lenses, numeral 7 a deflector, numerals 8 and 9 a demagnifying lens and a projection lens, respectively, and numeral 10 a surface of a sample such as a wafer.

A square aperture 2' on the mask 2 is imaged onto the mask 3 by the two shaping lenses 4 and 5. As a portion common to the imaged square aperture on the mask 3 and a square aperture 3' on the mask 3, a shaped beam 6 for lithography is formed. The size of this shaped beam 6 can be adjusted by the deflector 7 placed between the shaping lenses 4 and 5. The shaped beam 6 is demagnified and imaged onto the sample face 10 by the demagnifying lens 8 and the projection lens 9. The position of the shaped beam thus demagnified on the sample face 10 can be moved by a deflector 11 within the projection lens 9 in order to expose an arbitrary pattern.

FIGS. 2A and 2B illustrate the situation of pattern exposition. FIG. 2A corresponds to ideal operation of the above-described apparatus for lithography. Numeral 21 denotes the beam deflection range of the deflector 11, numeral 22 the direction of deflection, numeral 23 exposed patterns, and numeral 24 a shaped beam. If the direction of the shaped beam 24 is coincident with the direction of deflection 22 as illustrated in FIG. 2A, a desired pattern can be correctly exposed by successively connecting shaped beams.

In general, however, it is not easy to coincide the direction of the side of the shaped beam 24 with the deflection direction (scanning direction) 22. FIG. 2B shows the exposed pattern obtained when these two directions are not coincident. As evident from FIG. 2B, shaped beams are not aligned in the exposed pattern unless the two directions are coincident. As a result, a lowered dimension accuracy of the pattern or an unsmooth boundary is incurred.

In the prior art, the square masks 2 and 3 have been mechanically rotated for squaring the direction of the shaped beam with that of deflection as described in Japanese Patent Application Laid-Open No. 57761/78. When this method is used, it is impossible to square the center of the rotation axis with the center of the optical axis of the beam or the squared aperture. The beam directed toward the sample face 10 is cut by the apertures for defining the beam existing on the way. This results in a drawback that the current density of the shaped beam becomes ununiformed. In addition, such a method has a serious drawback that a long-time work by a prominent expert is required.

Therefore, an object of the present invention is to provide an apparatus for electron beam lithography wherein the above-described drawbacks in the conventional apparatus for lithography are eliminated and the direction of the shaped beam may be readily adjusted without deteriorating the uniformness in the current density of that shaped beam.

The above object is accomplished by an apparatus for lithography comprising a mask equipped with a polygonal aperture to be subjected to electron beam irradiation fed from an electron beam generator means, an electron lens system for demagnifying and imaging the polygonal aperture of the mask, and a solenoid lens for electron beam rotation adjustment placed between the mask and the final-stage electron lens.

The present invention will be apparent from the following description taken in conjunction with the accompanying drawings, in which:

FIG. 1 shows the principle of an apparatus for lithography;

FIGS. 2A and 2B illustrate the relationship between a shaped beam and an exposed pattern;

FIG. 3 shows an embodiment of an apparatus for lithography according to the present invention; and FIG. 4 shows the locus of an electron when a solenoid lens is operated.

The principle of the present invention will be first described and an embodiment of the present invention will be thereafter described in detail.

In general, an electron beam is subjected to rotation effect when it passes through a magnetic field. At this time, a rotation angle $\theta$ may be represented as $$\theta = \frac{1}{2} \sqrt{\frac{e}{2m_0 V}} \int B(z)\, dz, \qquad (1)$$

where $e$ and $m_o$ are respectively the charge and mass of an electron, $V$ the acceleration voltage, and $B(z)$ the intensity of the magnetic field in the direction whereto the electron is running.

When the magnetic field is caused by a solenoid coil (hereinafter referred to as solenoid lens), the above-described rotation angle $\theta$ is proportional to the excitation coefficient and may be represented as $$\theta \propto \frac{IN}{\sqrt{E}}, \qquad (2)$$

where $I$ is a current flowing through the solenoid, $N$ the number of turns in the coil, and $E$ the energy of an electron represented in the unit of eV.

$$\frac{IN}{\sqrt{E}} = 6,$$

$\theta$ is approximately 1 rad.

In accordance with the present invention, the shaped beam is electromagnetically rotated using the above-described rotation effect.

In the following, an embodiment of the present invention will be described in detail.

FIG. 3 shows an embodiment of the present invention. In this apparatus, a solenoid lens 12 is placed in the space between the second shaping aperture (hereinafter abbreviated as aperture) 3 and the demagnifying lens 8 of the apparatus illustrated in FIG. 1. Other numerals 1 to 11 denote the same components as FIG. 1.

It is general to keep a sufficient distance between the above described second shaping aperture 3 and the demagnifying lens 8. Accordingly, it is easy to place the solenoid lens 12 in the space between them.

The rotation angle of the shaped beam may be increased by increasing the excitation coefficient of the solenoid lens 12 placed as illustrated in FIG. 3. It is also possible to invert the rotation direction of the shaped beam by inverting the excitation direction.

If the excitation of the solenoid lens 12 is made controllable from a controller for controlling other lenses, the excitation may be easily operated by an operator.

Since the solenoid lens 12 exerts not only a rotation effect but also a focusing effect upon the electron beam, the following restriction conditions are imposed on the focal distance of the solenoid 12. The first condition is that the position of the focus must not be largely deviated when the solenoid lens is excited to rotate the shaped beam. The second condition is that the beam axis deviation caused by excitation of the solenoid lens must fall within the permissible tolerance.

Now, these conditions will be quantitatively studied. FIG. 4 shows the locus of an electron before and after the solenoid lens 12 in detail.

At first, the first condition will be described. The shaped beam 6 which has been shaped by the aforementioned aperture is demagnified and imaged onto a point 31 by a demagnifying lens 8. The demagnifying ratio is assumed to be 1/M. When the solenoid lens 12 is activated, the imaged point is deviated by $\Delta z$. The $\Delta z$ may be represented as $$\Delta z \approx \frac{l_1^2}{M^2 F}, \quad (3)$$

where $l_1$ denotes a distance from the aperture 3 to the center of the solenoid lens 12 and F denotes the focal distance of the solenoid lens 12.

As evident from the expression (3), it is necessary to decrease $l_1$ and increase F and M when $\Delta z$ is to be decreased. In practice, the solenoid lens 12 is placed nearly at the middle point between the aperture 3 and the demagnifying lens 8. Hence, $$l_1 \approx L/2,$$

where L denotes a distance between the aperture 3 and the demagnifying lens 8. In addition, the relationship between F and L may be represented as $$\frac{F}{L} = \frac{L}{4M^2} \cdot \frac{1}{\Delta z}. \quad (4)$$

Substituting practical values for L, M and $\Delta z$ (L=10–20 cm, M=10–20 and z=10–20 μm), we have $$F/L = 3 \text{ to } 50. \quad (5)$$

The second condition will now be described. The beam axis deviation under the excitation of the solenoid lens 12 is caused by the center of the solenoid lens 12 which is not coincident with an axis connecting the aperture 3 and the demagnifying lens 8. This deviation is denoted by h. The crossover image of the electron beam source is focused at a point 32 near the front focus of the demagnifying lens 8. The size of the image thus focused is close to the crossover diameter. The deviation $\Delta r$ of the crossover image in the direction which is perpendicular to the axis is approximately represented as $$\Delta r = \frac{l_2 h}{F}. \quad (6)$$

For decreasing $\Delta r$, the expression (6) indicates the necessity of a small $l_2$ (which is opposite to a small $\Delta z$), a small h and a large F. Assuming from the practical point of view that $$l_2 \approx L/2,$$

we have $$\frac{F}{L} = \frac{h}{2 \cdot \Delta r}. \quad (7)$$

In the expression (7), it is difficult to get h which is 0.1 mm or less because of the error brought about during mechanical set-up. And $\Delta r$ is only permitted to be up to approximately 10 μm which is a crossover diameter. Therefore, it follows that $$F/L \geq 5 \quad (8)$$

Expressions (5) and (8) indicate that the focal distance F of the solenoid lens 12 must be at least five times as large as the distance L between the above described aperture 3 and the demagnifying lens 8. Since L is usually approximately 20 cm, F must be 1 m or more.

Assuming that $\theta$ is required to be approximately $\pm 5°$ for rotation adjustment, the excitation coefficient satisfying $$\frac{IN}{\sqrt{E}} \approx 0.5$$

is sufficient. At this time, it is easy to attain a focal distance of 1 m or more by using a solenoid lens. The solenoid lens used in the above-described embodiment is sometimes called as a rotation lens, a solenoid coil, a rotation coil or the like.

In the described embodiment, a demagnifying lens composed of one stage has been shown as an example. However, a plurality of or multi-stage of demagnifying lenses may be used when the demagnification ratio must be made larger. In such a case, the above-described solenoid lens may be placed between arbitrary demagnifying lenses. That is to say, the solenoid lens may be arbitrarily placed between the above-described aperture and the final-stage demagnifying lens.

In addition, the described concept of the present invention may essentially be applied to a case where the solenoid is placed between the aperture and the projection lens or a case where the projection lens functions also as a demagnifying lens.

In the described embodiment, a shaped beam for lithography has been square shaped. However, it is a matter of course that the shape of a shaped beam is not restricted to a square.

According to the present invention heretofore described, in an apparatus for lithography having a mask equipped with a polygonal aperture subjected to electron beam irradiation fed from an electron beam generator means and an electron lens system for demagnifying and imaging the polygonal aperture of the mask, a solenoid coil for electron beam rotation adjustment is placed between the mask and a final electron lens, thus realizing an apparatus for lithography wherein the direction of the shaped beam may be readily adjusted without deteriorating the uniformness in the current density of that shaped beam.

We claim:

1. An apparatus for electron beam lithography comprising:
   means for generating an electron beam;
   first electrooptic means for shaping said electron beam to yield a desired sectional shape, said first electrooptic means including at least one mask having a polygonal aperture;
   second electrooptic means for demagnifying and imaging a shaped beam produced by said first electrooptic means onto a sample face and for deflecting the shaped beam; and
   third electrooptic means placed between said first and second electrooptic means for rotating and adjusting said shaped beam, said third electrooptic means including a solenoid coil having a focal distance which is at least five times as large as the distance between said first and second electrooptic means.

2. An apparatus for electron beam lithography according to claim 1, wherein said first electrooptic means includes first and second masks respectively having first and second polygonal apertures and means for deflecting an electron beam passed through said first polygonal aperture and imaging said electron beam onto said second polygonal aperture.

3. an apparatus for electron beam lithography according to claim 1, wherein said second electrooptic means includes at least one-stage demagnifying lens, a projection lens and a deflector, and said third electrooptic means is placed between said polygonal aperture and either the final-stage demagnifying lens or said projection lens.

4. An apparatus for electron beam lithography according to claim 1, wherein said second electrooptic means includes a deflector and a projection lens which functions also as a demagnifying lens, and said third electrooptic means is placed between said polygonal aperture and said projection lens.

5. An apparatus for electron beam lithography according to claim 2, wherein said second electrooptic means includes at least one demagnifying lens, a projection lens and a deflector, and said third electrooptic means is placed between said seocnd polygonal aperture and either final one of said demagnifying lens or said projection lens.

6. An apparatus for electron beam according to claim 2, wherein said second electrooptic means includes a deflector and a projection lens which functions also as a demagnifying lens, and said third electrooptic means is placed between said second polygonal aperture and said projection lens.

* * * * *